(12) United States Patent
Wu (10) Patent No.: US 9,870,439 B2
(45) Date of Patent: Jan. 16, 2018

(54) METHODS AND SYSTEMS FOR BOREHOLE IMAGE FORWARD MODELING OF FORMATION PROPERTIES

(75) Inventor: Zhi Qin Wu, Beijing (CN)

(73) Assignee: Halliburton Energy Services, Inc., Houston, TX (US)

( * ) Notice: Subject to any disclaimer, the term of this patent is extended or adjusted under 35 U.S.C. 154(b) by 645 days.

(21) Appl. No.: 14/404,127

(22) PCT Filed: Aug. 10, 2012

(86) PCT No.: PCT/US2012/050258
§ 371 (c)(1),
(2), (4) Date: Nov. 26, 2014

(87) PCT Pub. No.: WO2014/025354
PCT Pub. Date: Feb. 13, 2014

(65) Prior Publication Data
US 2015/0186567 A1    Jul. 2, 2015

(51) Int. Cl.
*G06F 17/10*    (2006.01)
*G06F 17/50*    (2006.01)
*E21B 47/00*    (2012.01)

(52) U.S. Cl.
CPC ...... *G06F 17/5009* (2013.01); *E21B 47/0002* (2013.01); *G06F 17/10* (2013.01)

(58) Field of Classification Search
CPC .............................. E21B 49/00; G06F 17/5018
USPC ........................................................ 703/2, 10
See application file for complete search history.

(56) References Cited

U.S. PATENT DOCUMENTS

| | | | |
|---|---|---|---|
| 6,374,185 B1 | 4/2002 | Taner et al. | |
| 6,549,854 B1 | 4/2003 | Malinverno et al. | |
| 7,291,364 B2 * | 11/2007 | Faulkner | G06T 17/05 |
| | | | 427/427.2 |
| 7,359,845 B2 * | 4/2008 | Kelfoun | E21B 7/046 |
| | | | 324/303 |
| 7,382,135 B2 | 6/2008 | Li et al. | |

(Continued)

FOREIGN PATENT DOCUMENTS

| | | |
|---|---|---|
| EP | 0745870 A2 | 12/1996 |
| WO | 2006/053294 A1 | 5/2006 |
| WO | 2009/075667 A2 | 6/2009 |

OTHER PUBLICATIONS

International Search Report issued in related PCT Application No. PCT/US2012/050258, dated May 3, 2013, 5 pages.

(Continued)

*Primary Examiner* — Andy Ho
(74) *Attorney, Agent, or Firm* — John Wustenberg; Baker Botts L.L.P.

(57) ABSTRACT

A method and system for improving borehole image forward modeling of formation properties is disclosed. An imaginary circle (106) having a plurality of bins (202) is centered at a location of interest at an axial position along the target wellbore (102). The imaginary circle is perpendicular to an axis (110) of the target wellbore and represents a region of the formation to be analyzed. A pseudo log relating to the parameter of interest at the axial position along the target wellbore is then determined. The pseudo log comprises at least a value for the parameter of interest at a desired point corresponding to one of the plurality of bins. The determined pseudo log is then visualized.

17 Claims, 5 Drawing Sheets

(56) References Cited

U.S. PATENT DOCUMENTS

| | | | |
|---|---|---|---|
| 2005/0140373 A1 | 6/2005 | Li et al. | |
| 2006/0293872 A1 | 12/2006 | Zamora et al. | |
| 2009/0198447 A1 | 8/2009 | Legendre et al. | |
| 2011/0011595 A1* | 1/2011 | Huang | E21B 43/00 166/369 |
| 2012/0173216 A1* | 7/2012 | Koepsell | E21B 49/00 703/6 |

OTHER PUBLICATIONS

Written Opinion issued in related PCT Application No. PCT/US2012/050258, dated Mar. 3, 3014, 6 pages.

International Preliminary Report on Patentability issued in related PCT Application No. PCT/US2012/050258, dated Jun. 3, 2014, 22 pages.

* cited by examiner

METHODS AND SYSTEMS FOR BOREHOLE IMAGE FORWARD MODELING OF FORMATION PROPERTIES

CROSS-REFERENCE TO RELATED APPLICATION

This application is a U.S. National Stage Application of International Application No. PCT/US2012/050258 filed Aug. 10, 2012, which is hereby incorporated by reference in its entirety.

BACKGROUND

Hydrocarbons, such as oil and gas, are commonly obtained from subterranean formations. The development of subterranean operations and the processes involved in removing hydrocarbons from a subterranean formation are complex. Typically, subterranean operations involve a number of different steps such as, for example, drilling the wellbore at a desired well site, treating the wellbore to optimize production of hydrocarbons, and performing the necessary steps to produce and process the hydrocarbons from the subterranean formation.

Modern oil field operations demand a great quantity of information relating to the parameters and conditions encountered downhole. Such information may include characteristics of the earth formations traversed by the borehole and data relating to the size and configuration of the borehole itself. The collection of information relating to conditions downhole, which commonly is referred to as "logging," can be performed by several methods, including wireline logging, measurement-while-drilling (MWD), logging-while-drilling (LWD), drillpipe conveyed logging, and coil tubing conveyed logging. A variety of logging tools are available for use with each of these methods. These logging tools may be used to perform wellbore imaging. Wellbore imaging is an important aspect of drilling and geosteering when performing subterranean operations.

The variations in formation properties around the wellbore may be used to obtain information regarding ongoing operations such as, for example, dip angle and direction of the formation the wellbore is cutting through. For instance, dip angles may be obtained from a wellbore density image and compared with real geosteering data as a method of quality control. Moreover, drilling engineers may predict what the wellbore images may look like prior to drilling the wellbore and may use that information to assist the drilling team in evaluating the applicability of various imaging tools for the particular well and depositional environment.

It is, therefore, desirable to develop reliable methods and systems to perform wellbore image forward modeling for homogenous properties of a formation that is traversed by the wellbore. Typical forward modeling methods simulate a logging tool's responses to formation properties. As a result, the modeling results are highly dependent upon the particular logging tool design and related physics theory. It is desirable to obtain modeling results that are not dependent upon a particular logging tool.

While embodiments of this disclosure have been depicted and described and are defined by reference to exemplary embodiments of the disclosure, such references do not imply a limitation on the disclosure, and no such limitation is to be inferred. The subject matter disclosed is capable of considerable modification, alteration, and equivalents in form and function, as will occur to those skilled in the pertinent art and having the benefit of this disclosure. The depicted and described embodiments of this disclosure are examples only, and are not exhaustive of the scope of the disclosure.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

For the purposes of this disclosure, computer-readable media may include any instrumentality or aggregation of instrumentalities that may retain data and/or instructions for a period of time. Computer-readable media may include, for example, without limitation, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such as wires, optical fibers, microwaves, radio waves, and other electromagnetic and/or optical carriers; and/or any combination of the foregoing.

The term "uphole" as used herein means along the drillstring or the wellbore hole from the distal end towards the surface, and "downhole" as used herein means along the drillstring or the wellbore hole from the surface towards the distal end. The term "strike" as used herein refers to the direction of a line formed by the intersection of the surface of an inclined bed with a horizontal plane. The term "relative dip angle" as used herein refers to the angle between a line normal to the bedding plane ("pole") and the wellbore axis measured in their common plane. The term "dip" as used herein refers to the angle of slope of an inclined bed measured perpendicular to the strike and in the vertical plane, referenced to the horizontal plane. The term "dip azimuth" as used herein refers to the direction of the dip measured perpendicular to the strike and referenced to the north. The term "azimuth" as used herein refers to the angle of the wellbore direction as projected to a horizontal plane and relative to the north pole with a 0 degree azimuth coinciding with North, a 90 degree azimuth coinciding with East, a 180 degree azimuth coinciding with South, and a 270 degree azimuth coinciding with West. The term "inclination" as used herein refers to the degree of a wellbore's deviation from the vertical or stated otherwise, the angle between direction of gravity and the wellbore direction.

Illustrative embodiments of the present invention are described in detail herein. In the interest of clarity, not all features of an actual implementation may be described in this specification. It will of course be appreciated that in the development of any such actual embodiment, numerous implementation-specific decisions may be made to achieve the specific implementation goals, which may vary from one implementation to another. Moreover, it will be appreciated that such a development effort might be complex and time-consuming, but would nevertheless be a routine undertaking for those of ordinary skill in the art having the benefit of the present disclosure.

To facilitate a better understanding of the present invention, the following examples of certain embodiments are given. In no way should the following examples be read to limit, or define, the scope of the invention. Embodiments of the present disclosure may be applicable to horizontal, vertical, deviated, or otherwise nonlinear wellbores in any type of subterranean formation. Embodiments may be applicable to injection wells as well as production wells, including hydrocarbon wells. Embodiments may be implemented using a tool that is made suitable for testing, retrieval and sampling along sections of the formation. Embodiments may be implemented with tools that, for example, may be conveyed through a flow passage in tubular string or using a wireline, slickline, coiled tubing, downhole robot or the like. "Measurement-while-drilling" ("MWD") is the term generally used for measuring conditions downhole concerning the movement and location of the drilling assembly while the drilling continues. "Logging-while-drilling" ("LWD") is the term generally used for similar techniques that concentrate more on formation parameter measurement. Devices and methods in accordance with certain embodiments may be used in one or more of wireline, MWD and LWD operations.

The present application is directed to improving performance of subterranean operations and more specifically, to a method and system for improving borehole image forward modeling of formation properties.

In accordance with an embodiment of the present disclosure, offset well data existing within an interpreted structural model may be utilized to generate forward modeled wellbore images of a target wellbore. As discussed in more detail below, the methods and systems disclosed herein may be applicable to gamma and density forward modeling functions when performing geosteering. Moreover, continuous modeled wellbore images of gamma and density along a target well path may be observed in order to better understand and compare actual and modeled geological properties of a formation of interest.

In accordance with an embodiment of the present disclosure, a calculation methodology is provided which involves a three dimensional spatial calculation and a pseudo log value calculation. The term pseudo log as used herein refers to a log data obtained using the forward modeling methods disclosed herein that reflects a particular parameter of interest.

Figure 1:
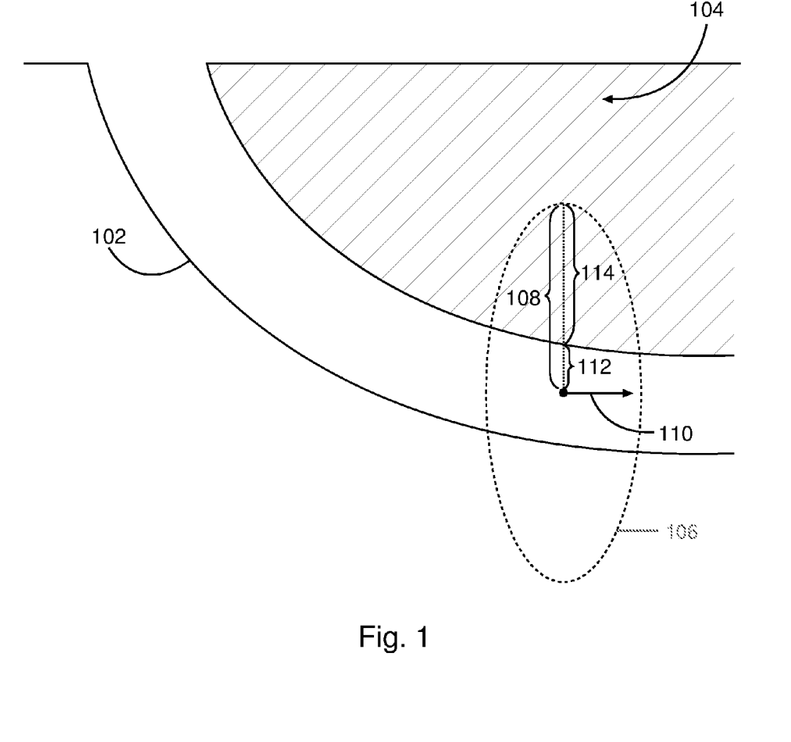
FIG. 1 depicts an exemplary wellbore traversing a formation.
Figure 2A:
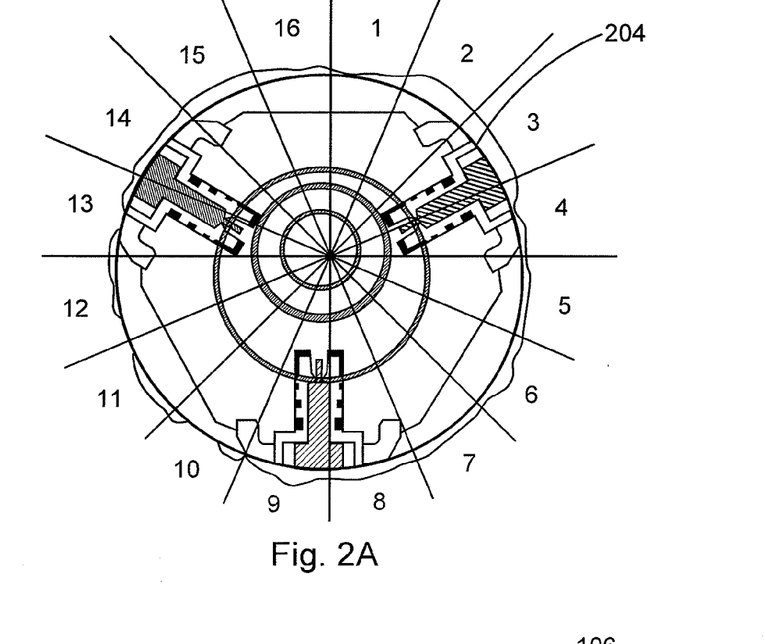
FIG. 2A shows a front view of an intersection of an actual logging tool placed in a wellbore.

Turning now to FIG. 1, a wellbore 102 is depicted which traverses a formation 104. The wellbore 102 may have any orientation such as, for example, a vertical wellbore, a horizontal wellbore, etc., without departing from the scope of the present disclosure. An imaginary circle 106 may then be centered at the wellbore 102 path with a radius 108 corresponding to the Range of Investigation (ROI) and a plane that is perpendicular to the wellbore axis 110. The ROI is equal to the borehole radius 112 plus the depth of investigation (DOI) 114 which extends into the formation as shown in FIG. 1. The imaginary circle 106 may represent a region of the formation that is being analyzed by a logging tool, such as a MWD or LWD tool. FIG. 2A shows a front view of an intersection of an actual logging tool placed in a wellbore. The outmost circle 204 denotes the tool's external surface. In operation, as the logging tool moves through a point in the wellbore, it may measure a number of bins' data of surrounding rock and formation. The obtained data may cover the whole azimuth around the wellbore. The logging tool may use this obtained data to produce a wellbore image. Forward modeling entails a prediction of wellbore image before the real measurement is obtained. Accordingly, in order to obtain forward modeling, the bins (202) may be simulated.

Figure 2B:
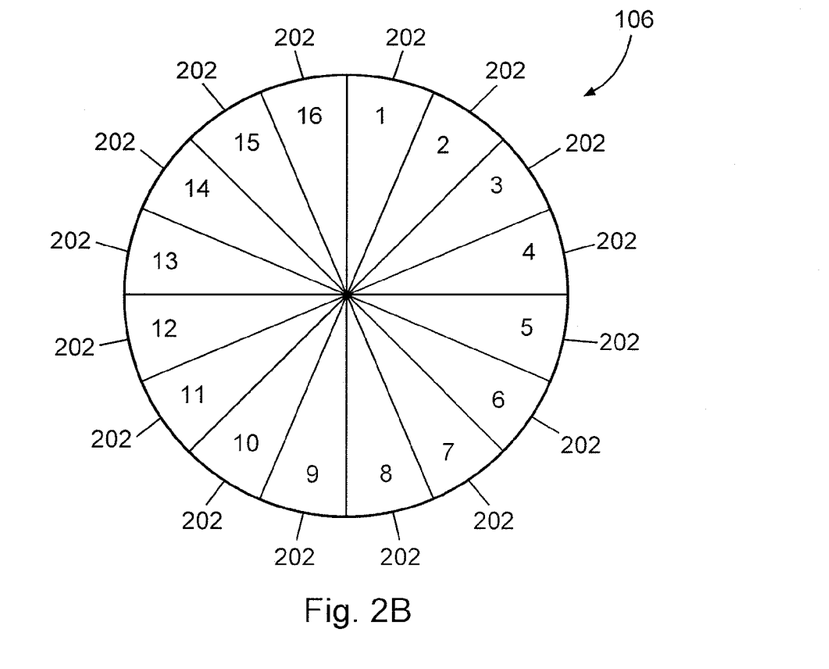
FIG. 2B is a frontal view of the imaginary circle of FIG. 1.

FIG. 2B provides a simplified representation of a logging tool's intersection and measurement principle. FIG. 2B depicts a front view of the circle 106 of FIG. 1. The imaginary circle 106 may be divided into a number of bins 202 which divide the imaginary circle 106 into substantially equal segments. As discussed in more detail below, the 3-dimensional ("3D") spatial coordinates of the bins 202 may be calculated in accordance with the present disclosure and a pseudo log algorithm may be leveraged to compute the pseudo values of a parameter of interest at each bin position. Specifically, the logging tool may measure formation property values at positions of all bins 202 of the imaginary circle 106 whose center is the wellbore axis 110 and has a radius equal to the ROI. As shown in FIG. 2B, the bins 202 divide the imaginary circle 106 into a number of segments. Although 16 bins are depicted in the exemplary embodiment of FIGS. 2A and 2B, the present disclosure is not limited to any specific number of bins. For instance, in other embodiments, there may be 32, 48 or any other suitable number of bins. Bin 1 is assumed to be at the top of the imaginary circle 106 at an angle of 0°. The angle denoting the position of each subsequent bin may then be determined as:

Bin Angle=(Bin No.−1)*[360/(Bin Quantity)]

Accordingly, in the exemplary embodiment of FIGS. 2A and 2B, the angle for Bin 2 is 22.5° and the angle for Bin 3 is 45°. The angle denoting the position of each subsequent bin may be deduced in the same manner.

Accordingly, at a first step, 3D spatial coordinates of the bins 202 may be calculated. Logging tools such as, for example, LWD tools may utilize equally sized bins, as shown in FIG. 2, to describe azimuthal change in a measured petrophysical property. In accordance with one exemplary embodiment as shown in FIG. 2, the imaginary circle 106 may be divided into 16 equally sized bins. Data may then be referenced to the high side of the imaginary circle 106 or to the earth's magnetic North. Specifically, in a deviated wellbore, data may be referenced to the high side of the imaginary circle 106 while in a vertical wellbore, data may be referenced to the earth's magnetic North. The bins 202 may be numbered with numerals 1-16 as shown in FIG. 2 such that the bin 202 with numeral 1 is positioned at the high side of the imaginary circle 106 or the magnetic North side of the wellbore 102 if storing magnetic oriented data in a vertical well. In contrast, the bin 202 with a numeral corresponding to [(No. of Bins/2)+1], in this case, bin 202 denoted with numeral 9, is situated at the low side of the imaginary circle or the South side of the wellbore 102 if storing magnetic oriented data in a vertical wellbore.

Accordingly, given the well path position, azimuth and inclination of the wellbore 102 path as well as the DOI and bin quantity, the 3D coordinates of all the bins 202 in the underground space may be calculated. Specifically, trigonometric functions may be used to calculate the bins' coordinates in accordance with an embodiment of the present disclosure. For instance, assume the coordinates of a well path at a point (P) underground are ($EW_P$, $NS_P$, $TVD_P$) ($EW_p$, $NS_p$, $TVD_p$) (where EW denotes east-west, NS denotes north-south, and TVD denotes total vertical depth); the length of DOI equals R; the azimuth of the well path at this point is azim; the inclination of the well path at this point is incl; $bin_i$ (i=1, 2, ..., N) is the ith bin; N is quantity of the bins; and the corresponding angle of the $bin_i$ is $angle_i$. Then the coordinate of the $bin_i$, defined as ($EW_i$, $NS_i$, $TVD_i$), can be calculated with below equations.

$$EW_i = EW_p + EW_{offset}$$

$$NS_i = NS_p + NS_{offset}$$

$$TVD_i = TVD_p + TVD_{offset}$$

In the equations, $$EW_{offset} = H_{offset} * \sin(angle_i)$$

$$NS_{offset} = H_{offset} * \cos(angle_i)$$

$$TVD_{offset} = R * \cos(bin_i) * \sin(incl)$$

And $$H_{offset} = R * \sqrt{\cos^2(bin_i) * \cos^2(incl) + \sin^2(bin_i)}$$

$$angle_i = \operatorname{Atan}\left(\frac{\sin(bin_i)}{\cos(bin_i) * \cos(incl)}\right) + azim$$

Figures 3A, 3B:
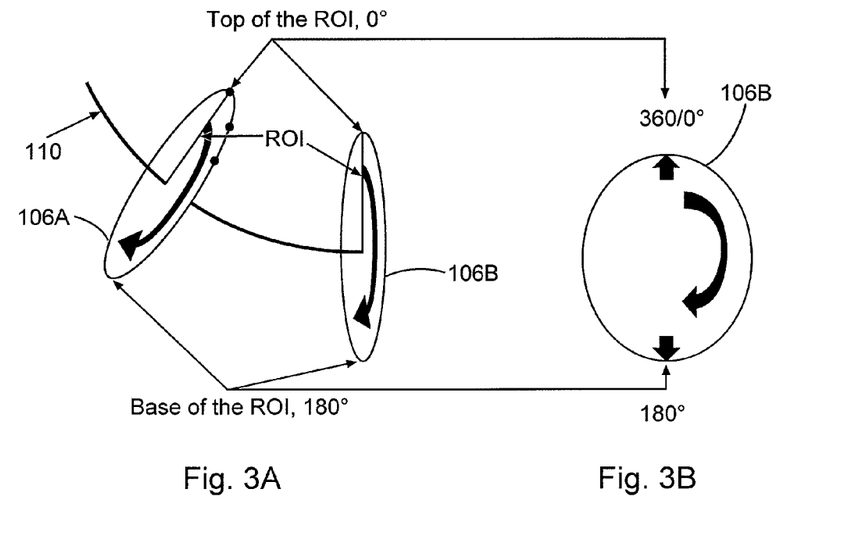
FIGS. 3A and 3B depict a procedure for determining a forward modeling image in accordance with an embodiment of the present disclosure.

The coordinates of the target wellbore 102 path may be obtained from well survey data, using interpolation methods from measured values of azimuth and inclination data. As would be appreciated by those of ordinary skill in the art, with the benefit of this disclosure, a number of methods may be used to obtain the coordinates of the target wellbore 102 through MWD. Such methods may include, but are not limited to, Minimum Curvature Method, Radius of Curvature Method, and the Tangential Method. Accordingly, a set of coordinates of 3D points may be obtained for a single position at a specific depth of the target wellbore 102. The quantity of the 3D points will equal the quantity of the bins 202 and the 3D points may be distributed at the edge of the imaginary circle 106. In accordance with the methods and systems disclosed herein, once the set of coordinates of 3D points are obtained as discussed above, the forward modeling image calculations may be performed. The input data to the forward modeling image calculation are the pseudo log bin values at the corresponding measured depth. FIG. 3 depicts a procedure for determining the forward modeling image in accordance with an embodiment of the present disclosure.

The circles 106A and 106B depict two exemplary positions for the imaginary circle 106 along the wellbore axis 110. Accordingly, the same number of modeling data ("pseudo log") may be obtained at each circle 106A, 106B. Specifically, the imaginary circle 106 may be positioned at a number of different axial positions along the wellbore and a pseudo log may be obtained repeatedly for each circle. The orientation of the imaginary circle 106 may change with the wellbore orientation. Specifically, as the wellbore axis 110 goes up, down or aims in different directions, the inclination and azimuth of the imaginary circle 106 at the particular location will also change in order to maintain the imaginary circle 106 at a position perpendicular to the wellbore axis 110. Accordingly, when the wellbore axis 110 is oriented in a vertical direction, the imaginary circle 106 will be oriented in a horizontal plane. In contrast, when the wellbore axis 110 is oriented in the horizontal direction, the imaginary circle 106 will be in a vertical plane. Finally, when the wellbore axis 110 is inclined, the imaginary circle 106 will also be an inclined circle. FIG. 3A depicts a side view of the imaginary circles 106A and 106B. In contrast, FIG. 3B depicts the imaginary circle 106B as viewed when looking down the wellbore towards a bottom of the wellbore 102 or a drill bit. As shown in FIGS. 3A and 3B, the first bin (Bin 1) is assumed to be at the top of the imaginary circle 106 at an angle of 0°. The bin angle will then increase in a clockwise direction as the bin number increases.

Figure 4:
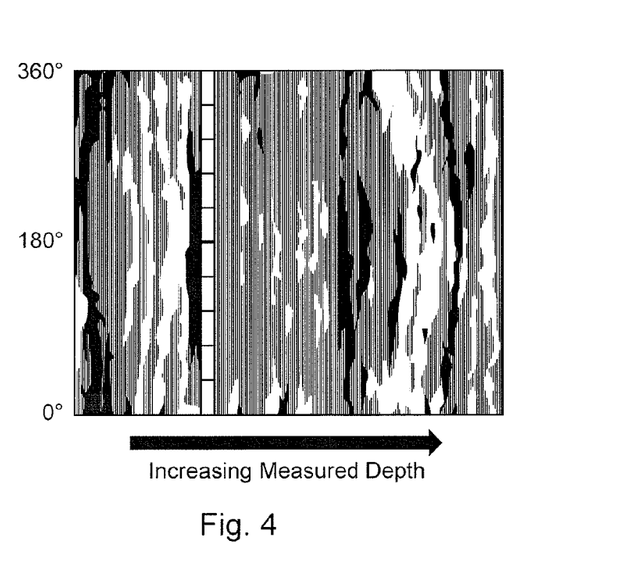
FIG. 4 depicts a wellbore image which visualizes forward modeling results with a VDL (Variable Density Log) with darker regions denoting higher values.

FIG. 4 depicts a visualization of the forward modeling results in a variable density log ("VDL"). As would be appreciated by those of ordinary skill in the art, with the benefit of this disclosure, a VDL may be used to represent a data set by replacing numbers with a visible image in order to easily observe the changes in data values. For instance, in FIG. 4, darker colors are used to show higher values while lighter colors denote lower values. Specifically, the wellbore 102 is a circle shape in 3D space. A VDL may be utilized to accurately represent a property of the wellbore 102 in 2D space. In FIG. 4, the vertical axis reflects the angle of the bins from 0°-360° and the horizontal axis is the measured depth of the well path. Accordingly, the VDL of FIG. 4 may be used to depict a property of interest at different bin locations along the wellbore 102 in a manner analogous to drawing with oil paint on a pillar, wrapping the pillar with white paper to monotype the paint and then unwrapping the white paper and spreading it out.

Pseudo logs are calculated according to offset well's log data and their location within an interpreted structural model. To calculate the Pesudo log, there should be at least one surface in the structural model and this surface must intersect at least one offset well. Because ground and formation surfaces are not flat horizontal planes, they often have terrain changes. Consequently, the structural models may be used as constraints or references.

In one embodiment, real log values from offset wells at proper corresponding coordinates are obtained first. Next, the offset log value at a desired point as well as the coordinates of the desired point are selected as input data. Spatial interpolation methods may then be leveraged to calculate the pseudo log value at the desired point on the target wellbore path. A number of interpolation methods including, but not limited to, Kriging method or Inverse Distance Weight ("IDW") method may be used to do the calculation. Implementation of such methods is well known to those of ordinary skill in the art and will therefore not be discussed in detail herein.

Figure 5:
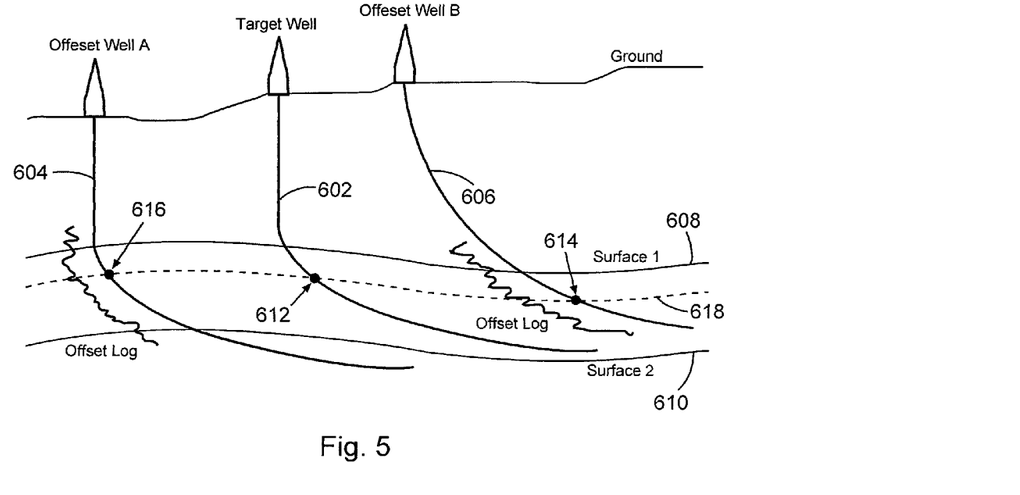
FIG. 5 depicts an exemplary procedure for obtaining a pseudo log in accordance with an embodiment of the present disclosure.

FIG. 5 depicts an exemplary procedure for obtaining a pseudo log in accordance with an embodiment of the present disclosure. Specifically, FIG. 5 depicts a target well 602 and two offset wells 604, 606. The well path coordinates and the real well log data of the offset wells 604, 606 are known. Additionally, the well path through which the target well 602 should pass is known. Two surfaces 608, 610 are provided in the structural model. In order to calculate the pseudo log value at a desired point 612 along the target wellbore 602, the surfaces 608, 610 may be used as a conference to look for proper corresponding coordinates 614, 616, respectively of offset wells (606, 608) as shown by the dashed line 618. The proper corresponding coordinates of offset wells (606, 608) are not necessarily points along the offset wells (606, 608) that have the same Total Vertical Depth ("TVD") value. The term TVD as user herein refers to the vertical distance from well head to the subsurface point. Instead, proper corresponding coordinates of offset wells (606, 608) are points that have relatively similar positions to the surfaces (608, 610) compared to the desired point 612.

The pseudo bin values along all or a portion of the target wellbore path 602 may be determined using the methods disclosed herein. Specifically, once calculations at a first desired point along the target wellbore path 602 are completed, the process may be repeated for a second desired point along the target wellbore path 602 in order to calculate pseudo log values at the second desired point. Accordingly, the process is repeated at different desired points along the target wellbore path 602 until pseudo log values for all desired points along the target wellbore path 602 are determined.

A similar method can be used to calculate pseudo log values for any arbitrary point in the underground space within the range of surfaces 608, 610. Specifically, the same method may be used to calculate pseudo log values at all bin positions around the imaginary circle 106 that is perpendicular to the wellbore path.

The pseudo log values essentially comprise a 3D model around the wellbore 102 path. The forward modeling image calculation searches for the values at a distance equal to ROI from the well path location for bins 1 through "n", where "n" is the total number of bins the user wishes to compute. In the exemplary embodiment of FIG. 2, n may be equal to 16. Accordingly, the modeled formation property values along the wellbore 102 may be obtained at its interception with the 3D pseudo log model. An image of forward modeling data may be comprised of many of these calculations along the length of the wellbore 102, with repeated calculations along the well path coordinates. In certain embodiments a survey measurement may be obtained at certain intervals along the wellbore path. For instance, in one embodiment survey measurements may be obtained every 30 ft. along the wellbore path. However, it may be desirable to determine well path coordinates at shorter intervals than the interval of survey measurements. For instance, it may be desirable to know wellbore path coordinates every 1 ft. along the wellbore path. Accordingly, interpolation may be used to calculate coordinates with the desired step size (e.g., 1 ft.) using the measured survey data that is obtained every 30 ft. along the wellbore path. As would be appreciated by those of ordinary skill in the art, with the benefit of this disclosure, a number of mathematical interpolation methods may be used for this purpose. These mathematical interpolation methods include, but are not limited to linear interpolation, spline interpolation, etc.

Figure 6:
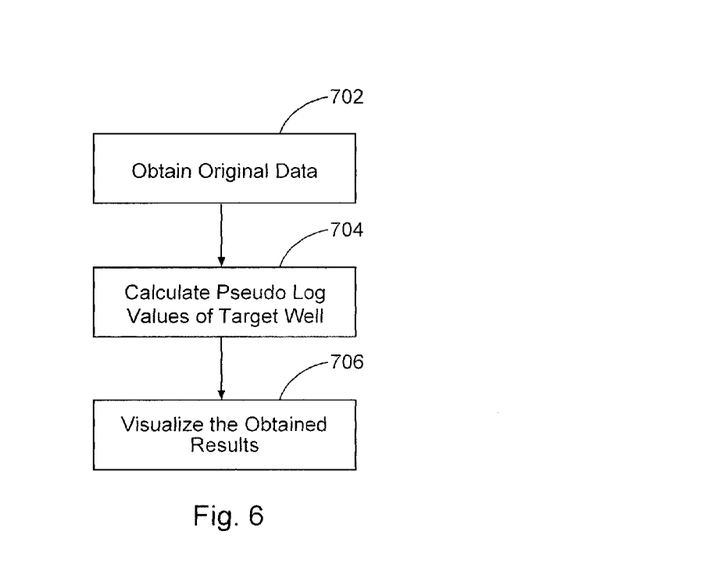
FIG. 6 depicts a flow chart of steps for performing forward modeling in accordance with an embodiment of the present disclosure.

FIG. 6 depicts a flow chart of steps for performing forward modeling in accordance with an embodiment of the present disclosure. In certain embodiments, the steps disclosed in FIG. 6 may be performed using an information handling system with a computer-readable medium to store information as needed. First, at step 702, original data may be obtained. In one embodiment, the original data may be loaded onto a computer-readable medium that is accessible to an information handling system. In one embodiment, the original data may include, but is not limited to, one or more of well log data of offset wells, well path coordinates data (survey data) of offset wells, well path coordinates data (survey data) of target well, and structural model data (at least one surface that intersects with the target well and at least one offset well). Next, at step 704, pseudo log values of the target well may be calculated. In certain embodiments, the information handling system may calculate the pseudo log values of the target well. Accordingly, at step 704, the process is initiated at a first desired point along the target wellbore path. One or more of azimuth, inclination and target point coordinates of the first desired points are utilized in conjunction with trigonometric functions to calculate coordinates of the bins of an imaginary circle perpendicular to the target wellbore path at the first desired point. For each bin position, the corresponding points from offset wells are obtained and used to obtain well log data of offset wells at the first desired point. Spatial interpolation (e.g., Kriging, IDW, etc.) may then be used to calculate pseudo log values at the bin position coordinate. The pseudo log values may be calculated for all bin positions at the first desired point in the same manner. The calculation results may then be stored in a computer-readable medium for the first desired point along the target wellbore path. The process is then repeated for subsequent points along the target wellbore path until values are determined for all points along the target wellbore path.

Finally, at step 706, the results obtained for the different bin positions at different desired points along the target wellbore path may be visualized using a VDL or other suitable method in order to permit viewing of continuous wellbore forward modeling images.

In one embodiment, the methods and systems disclosed herein may be carried out using an information handling system. Specifically, the information handling system may include a computer-readable medium. Machine readable instructions reflecting the methods disclosed herein may then be stored in the computer-readable medium and the information handling system's user interface may be used to monitor and manipulate the performance of different method steps in accordance with the present disclosure. Moreover, although a number of steps are disclosed in conjunction with the methods of the present disclosure, as would be appreciated by those of ordinary skill in the art, some of the method steps may be eliminated or modified without departing from the scope of the present disclosure.

Accordingly, the present disclosure facilitates the direct calculation of pseudo values at all bin positions around the target well path. As a result, the forward modeling method disclosed herein is independent of the particular logging tool design. Specifically, the disclosed method directly demonstrates the geology model of the formation without distortion. In the homogenous formation, the disclosed methods can be used directly in forward modeling to generate wellbore image of the specific properties of the formation. As to an anisotropic formation (i.e., a formation having properties with different values when measured in different directions), the methods are also effective for components forward modeling of anisotropic properties. Moreover, the disclosed methods are particularly efficient in instances when the special physical effect and response characteristics of the logging tool need not be considered. Accordingly, the methods disclosed herein may be applied to gamma and density forward modeling as well as other formation properties' forward modeling including, but not limited to, sonic, resistivity, porosity and saturation.

Example I

Density and gamma ray images are important in geosteering when determining the true direction and formation dip along with the apparent direction and dip in which the wellbore is cutting through the reservoir formations. Accordingly, picking dips from density images may provide valuable information for planning the wellbore ahead of the current trajectory in order to stay within the optimal position of the reservoir.

The methods and systems disclosed herein were applied to density and gamma ray forward modeling in StrataSteer®3D, a proprietary geosteering software produced by Halliburton Energy Services of Duncan, Okla. Desired curve aliases (a pseudo log generated from the selected offset wells) were selected from a drop down menu and a DOI and wellbore diameter were selected at a default value. The output data was written to the StrataSteer®3D interpretation run under the target wellbore. The forward modeling results may then be displayed as image track in the StrataSteer®3D display.

Figure 7:
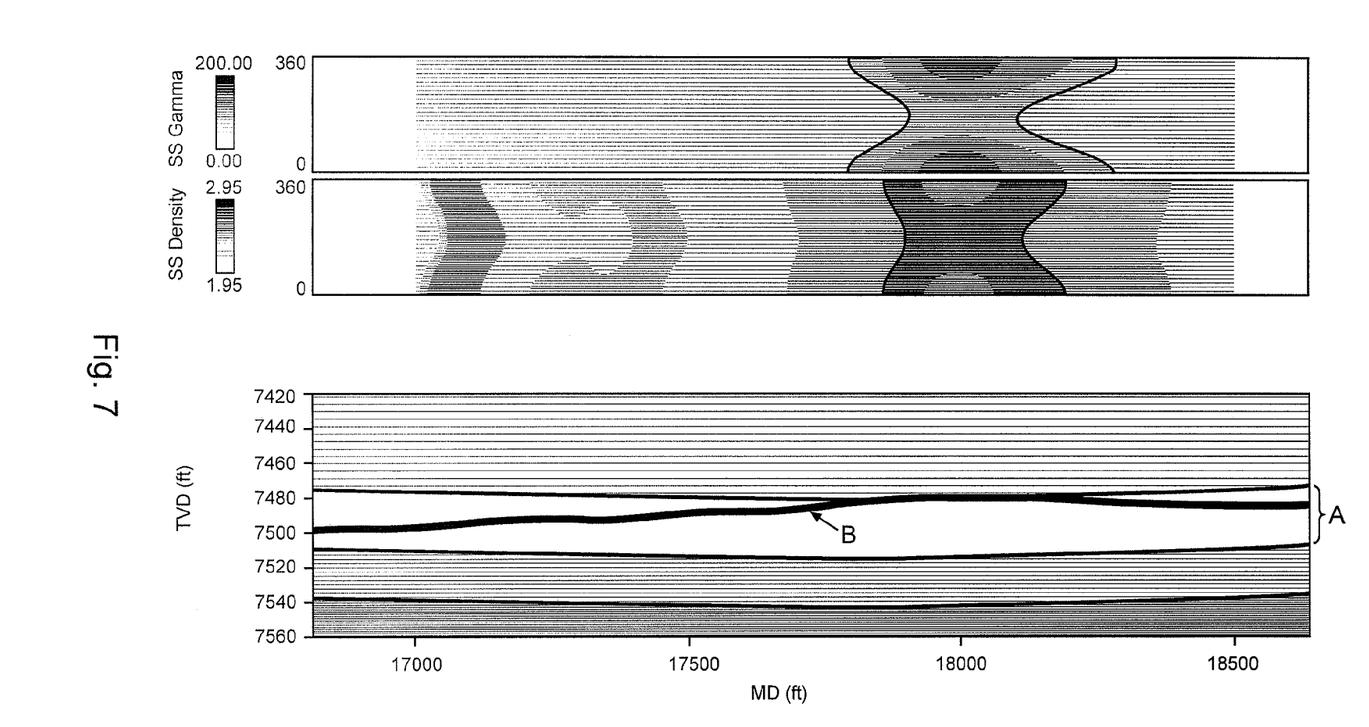
FIG. 7 depicts an example of forward modeling of gamma and density data in a horizontal section in accordance with an embodiment of the present disclosure.

FIG. 7 depicts an example of forward modeling of gamma and density data in a horizontal section. As shown in FIG. 7, from 17000 ft MD to 17500 ft MD, the density image (bottom track) is clearly displaying more information than the gamma ray image (top rack). It is showing that there are visible changes in the density within the formation in the section denoted with "A" (third track shows the geology and the cross-cutting well path with the line denoted with "B") for the user to see that the well path is drilling up dip (up through the formations). The well path flattens out, dips down slightly and then continues to drill up dip. The forward modeled density response is reminiscent of real data seen whilst drilling near parallel to a formation prior to drilling through it. The dips picked from the forward modeling images were within 0.2 degrees of what the geological model showed.

The present invention is therefore well-adapted to carry out the objects and attain the ends mentioned, as well as those that are inherent therein. While the invention has been depicted, described and is defined by references to examples of the invention, such a reference does not imply a limitation on the invention, and no such limitation is to be inferred. The invention is capable of considerable modification, alteration and equivalents in form and function, as will occur to those ordinarily skilled in the art having the benefit of this disclosure. The depicted and described examples are not exhaustive of the invention. Consequently, the invention is intended to be limited only by the spirit and scope of the appended claims, giving full cognizance to equivalents in all respects.

What is claimed is:

1. A method of wellbore image forward modeling for analyzing a target wellbore in a formation comprising:
centering an imaginary circle having a plurality of bins at a location of interest at an axial position along the target wellbore,
wherein the imaginary circle is perpendicular to an axis of the target wellbore;
and
wherein the imaginary circle represents a region of the formation to be analyzed;
determining a pseudo log at a desired point, wherein determining the pseudo log at the desired point comprises:
providing a first offset well and a second offset well, wherein the first offset well and the second offset well intersect a surface corresponding to the desired point;
determining one or more log values of a parameter of interest at a first point on the surface corresponding to the first offset well and at a second point on the surface corresponding to the second offset well; and
interpolating the one or more log values of the parameter of interest at the first point and at the second point to determine the pseudo log at the desired point;
wherein the pseudo log comprises at least a value for the parameter of interest at the desired point corresponding to one of the plurality of bins; and
visualizing the determined pseudo log.

2. The method of claim 1, wherein obtaining coordinates of the target wellbore comprises at least one of utilizing a Minimum Curvature Method, a Radius of Curvature Method, and a Tangential Method.

3. The method of claim 1, further comprising calculating 3-dimensional coordinates of the plurality of bins.

4. The method of claim 1, wherein interpolating the log value of the parameter of interest comprises using at least one of a Kriging method or an Inverse Distance Weight method.

5. The method of claim 1, wherein visualizing the determined pseudo log comprises rendering a variable density log.

6. An information handling system with a non-transitory computer-readable medium containing machine readable instructions to:
center an imaginary circle having a plurality of bins at a location of interest at an axial position along a target wellbore,
wherein the imaginary circle is perpendicular to an axis of the target wellbore;
and
wherein the imaginary circle represents a region of a formation to be analyzed;
determine a pseudo log at a desired point, wherein determining the pseudo log at the desired point comprises:
determining one or more log values of a parameter of interest at a first point corresponding to a first offset well and at a second point corresponding to a second offset well, wherein the first offset well and the second offset well intersect a surface corresponding to the desired point and the first point and the second point are positioned on the surface; and
interpolate the one or more log values of the parameter of interest at the first point and at the second point to determine the pseudo log at the desired point;
wherein the pseudo log comprises at least a value for the parameter of interest at a desired point corresponding to one of the plurality of bins; and
visualize the determined pseudo log.

7. The information handling system of claim 6, wherein coordinates of the target wellbore are obtained utilizing at least one of a Minimum Curvature Method, a Radius of Curvature Method, and a Tangential Method.

8. The information handling system of claim 6, further comprising calculating 3-dimensional coordinates of the plurality of bins.

9. The information handling system of claim 6, wherein the machine readable instructions to interpolate the log value of the parameter of interest use at least one of a Kriging method or an Inverse Distance Weight method.

10. The information handling system of claim 6, wherein the machine readable instructions to visualize the determined pseudo log render a variable density log.

11. A method of modeling formation property of a wellbore comprising:
  positioning an imaginary circle at a first axial position along a wellbore path traversing a formation, wherein the imaginary circle is substantially perpendicular to a wellbore axis of the wellbore, wherein the imaginary circle comprises a plurality of bins;
  calculating 3-dimensional coordinates of the plurality of bins at the first axial position;
  calculating a pseudo log for each of the plurality of bins at the first axial position, wherein calculating the pseudo log for each of the plurality of bins at the first axial position comprises:
    selecting one of the plurality of bins;
    determining one or more log values of a parameter of interest at a first point corresponding to a first offset well and at a second point corresponding to a second offset well, wherein the first point and the second point are positioned on a surface, and wherein the first offset well and the second offset well intersect the surface corresponding to the selected one of the plurality of bins; and
    interpolating the one or more log values of the parameter of interest at the first point and at the second point to determine the pseudo log at the selected one of the plurality of bins;
  wherein the pseudo log reflects the parameter of interest at the first axial position; and
  visualizing the calculated pseudo log for each of the plurality of bins at the first axial position.

12. The method of claim 11, wherein the pseudo logs for each of the plurality of bins are calculated using log data from one or more offset wells and an interpreted structural model.

13. The method of claim 11, further comprising:
  positioning the imaginary circle at a second axial position along the wellbore path traversing the formation,
  calculating 3-dimensional coordinates of the plurality of bins at the second axial position;
  calculating a pseudo log for each of the plurality of bins at the second axial position, wherein the pseudo log reflects the parameter of interest at the second axial position; and
  visualizing the calculated pseudo log for each of the plurality of bins at the second axial position.

14. The method of claim 11, wherein calculating 3-dimensional coordinates of the plurality of bins at the first axial position comprises at least one of utilizing a Minimum Curvature Method, a Radius of Curvature Method, and a Tangential Method.

15. The method of claim 11, wherein visualizing the calculated pseudo log comprises rendering a variable density log.

16. The method of claim 11, wherein interpolating the log value of the parameter of interest comprises using at least one of a Kriging method or an Inverse Distance Weight method.

17. The method of claim 11, wherein the parameter of interest is selected from a group consisting of density, porosity and saturation.

* * * * *